(12) United States Patent
Barraco et al.

(10) Patent No.: US 9,151,686 B2
(45) Date of Patent: Oct. 6, 2015

(54) MAGNETOELASTIC TORQUE SENSOR AND METHOD

(71) Applicant: Methode Electronics Malta Ltd., Mriehel (MT)

(72) Inventors: Ignazio Barraco, München (DE); Assed Mir, Halifax (GB); Johannes Gießibl, Amerang (DE)

(73) Assignee: Methode Electronics Malta Ltd., Mriehel (MT)

( * ) Notice: Subject to any disclaimer, the term of this patent is extended or adjusted under 35 U.S.C. 154(b) by 0 days.

(21) Appl. No.: 14/262,873

(22) Filed: Apr. 28, 2014

(65) Prior Publication Data

US 2014/0360285 A1 Dec. 11, 2014

(30) Foreign Application Priority Data

Apr. 30, 2013 (EP) .................................... 13165899

(51) Int. Cl.
*G01L 3/02* (2006.01)
*G01L 3/10* (2006.01)
*G01R 33/00* (2006.01)

(52) U.S. Cl.
CPC ................. *G01L 3/105* (2013.01); *G01L 3/102* (2013.01); *G01R 33/0029* (2013.01)

(58) Field of Classification Search
CPC ..... G01R 33/0029; G01L 3/104; G01L 3/102
USPC ...................................... 73/862.331–862.335
See application file for complete search history.

(56) References Cited

U.S. PATENT DOCUMENTS

| 2004/0164729 | A1* | 8/2004 | Ikeda et al. | ............... 324/207.21 |
| 2004/0217758 | A1* | 11/2004 | Leonard | .................... 324/207.2 |
| 2006/0267581 | A1* | 11/2006 | Wiese | ...................... 324/207.25 |
| 2009/0293642 | A1 | 12/2009 | Schmitz | |

(Continued)

OTHER PUBLICATIONS

Extended European Search Report dated Nov. 27, 2013 in European Patent Application No. 13 165 899.9.

*Primary Examiner* — Max Noori
(74) *Attorney, Agent, or Firm* — Plumsea Law Group, LLC

(57) ABSTRACT

The invention provides a method for reducing the noise in a signal from a torque sensor caused by near magnetic field sources. The torque sensor has a partially hollow longitudinally extending member, and a magneto-elastically active region including one region magnetically polarized such that the magnetized polarity becomes increasingly helically shaped as the applied torque increases; a plurality of primary magnetic field sensors arranged approximate the at least one region for outputting a first signal corresponding to a torque-dependent magnetic flux emanating from the active region; at least one secondary magnetic field sensor axially spaced in a first direction by a pre-determined first distance from the plurality of primary magnetic field sensors for outputting a second signal corresponding to an ambient magnetic flux emanating from a near magnetic field source; at least one secondary magnetic field sensor axially spaced in a second direction opposite the first direction by a pre-determined second distance from the plurality of primary magnetic field sensors for outputting a third signal corresponding to the ambient magnetic flux emanating from the near magnetic field source; means for adjusting the first signal using the second and the third signals thereby compensating for the effects of the near magnetic field.

12 Claims, 6 Drawing Sheets

(56) References Cited

U.S. PATENT DOCUMENTS

2011/0005340 A1* 1/2011 Jeon et al. ................ 73/862.193
2012/0074933 A1   3/2012 Lee

* cited by examiner

MAGNETOELASTIC TORQUE SENSOR AND METHOD

FIELD OF THE INVENTION

The invention is related in general to systems and methods involving the use of magnetic field sensors, and in particular the invention is related to systems, methods and apparatuses involving sensors and circuits that cancel magnetic field noise while measuring torque-induced magnetic fields.

DESCRIPTION OF THE RELATED ART

US Pat. No. 2012/0074933 A1, the disclosure of which is incorporated herein by reference in its entirety, discloses torque sensors and methods for reducing the noise in a signal from a torque sensor caused by near magnetic field sources using magnetic field sensors which are arranged proximate to a longitudinally extending member with a magneto-elastically active region directly or indirectly attached to or forming a part of the surface of the member in such a manner that torque applied to the member is proportionally transmitted to the active region. The active region comprises at least one region magnetically polarized such that the magnetized polarity becomes increasingly helically shaped as the applied torque increases. The signals from the magnetic field sensors are processed in a manner that the effects of the near magnetic field source are compensated.

U.S. Pat. No. 5,351,555, the disclosure of which is incorporated herein by reference in its entirety, discloses a single circularly magnetized region in which the magnetic dipoles tilt in the presence of torsional stress, thereby emanating an externally measurable magnetic field. Because magnetic fields, in the context of their measurement, are fungible, the sensor taught in the '555 patent may be susceptible to other magnetic field of exterior origin. In particular, the Earth's magnetic field will cause a phenomenon known as "compassing", in which the measured field is the sum of the torque dependent field plus the Earth's north-south magnetic field component. Within the context of this disclosure, the term "compassing" shall be used to describe any error resulting from interaction between the magnetic field sensors and magnetic fields of external origin.

U.S. Pat. No. 5,520,059, the disclosure of which is also incorporated herein by reference in its entirety, addresses the compassing issue with the addition of an adjacent second region that is magnetized in the opposite circular direction to the first region. This arrangement yields two torque-dependent magnetic fields and, because the acquiescent magnetization of the regions is in opposite directions, the torque-dependent magnetic fields are of equal but opposite magnetic polarity. Corresponding with the two regions described in the '059 patent are two magnetic field sensors, each with an opposite axial polarity to the other (but with the same polarity relative to each of the corresponding magnetized regions). Thus, an ambient magnetic far field affects each of the field sensors in an equal but opposite manner, thereby canceling its measurement. That is, a non-divergent (far) field would affect each of the corresponding field sensors with approximately equal magnitude, but with opposite polarity (owing to their installed configuration); thus by summing the outputs all common mode external magnetic fields would be cancelled.

While the teachings of the '059 patent are effective when dealing with far fields, a divergent near field can expose each of the two magnetic field sensors to distinctly different field intensities and direction. In this scenario, the two field sensor outputs will not reflect equal but opposite error components that cancel each other, but rather unequal and opposite components that introduce an error to the measurement. In practice, the configuration of the invention disclosed in the '059 patent is error-prone in the presence of locally divergent magnetic fields because the two magnetic field sensors experience different magnitudes of the divergent magnetic fields. The difference in magnetic fields between the two magnetic field sensors originating from a near field source combines non-uniformly with torque induced magnetic fields and leads to a false torque value. Thus, it is important to eliminate this near field effect.

There are numerous other types of near field sources that can compromise an accurate torque-dependent field measurement. These sources include a permanent magnet, a magnetized wrench, a motor or solenoid, etc. Another would be the nearby presence of a ferromagnetic structure that distorts the shape and direction of the earth's magnetic field, creating a localized area in which the magnetic flux is concentrated in an undesirable direction. Each of these examples results in a divergent magnetic field, i.e., one in which there are significant local gradients in both magnetic field strength and flux direction.

There are numerous methods for canceling the effects of near field source or stray magnetic fields. These include employing shielding and using flux directors. Each of these types of structures is made from materials having a high magnetic permeability, meaning that they present a much lower resistance to magnetic fields than, for example, air. In principle, a shield would be in the form of a tube of infinite length, although shorter finite lengths may suitably function. Magnetic fields originating outside of the shield are effectively shunted through the highly permeable shield material, which prevents them from intersecting the field sensors. Using a different approach, a flux director "gathers" most of the torque dependent magnetic field and directs it into the magnetic field sensors. With this approach, the flux director geometry is such that its effectiveness of gathering the torque dependent magnetic field of interest is much greater than its effectiveness of gathering extraneous and error inducing magnetic fields, thus increasing the efficiency of the magnetic field sensors and hence, their signal to noise ratio.

While the shielding method noted above can be effective for external magnetic fields perpendicular to the axial direction of a shield in the form of a tube, this shield is very vulnerable to external magnetic fields in the axial direction of the tube which is open at both ends. Any external magnetic fields can transfer to the field sensors inside the shield through the sides of the shield which are open.

Flux director structures typically operate by gathering the radial flux component of the torque dependent magnetic field, and are therefore well suited for rejecting axially directed flux of external origin, however, flux directors tend to be susceptible to external fields perpendicular to the axis of the shaft.

A combination of tubular shielding and flux directors would act in a complimentary manner by effectively mitigating both axially and radially directed fields of external origin acting directly on the field sensing devices. However, such a combination has other shortcomings that limit its desirability in many applications including cost and packaging within the design.

If an external magnetic field source is directly contacted with the end of a shaft such as the end of the column of an electric power steering system, a strong external near field could transfer to the field sensors through the shaft as a result of diametric variations in the shaft or nearby magnetically coupled structures such as, for example, a bearing or mounting flange. Moreover, a typical manufacturing process for a column or shaft may include a magnetic particle inspection (MPI) process that involves a magnetization process for guiding magnetic particles into the defect sites for visualization of defects on column surface, and a demagnetization process after finishing the inspection. Frequently, demagnetization is not perfect, and there remains a remanent magnetic field in the column or shaft after the MPI process. Typical values of the remanent magnetic fields are between 10 and 100 Gauss. This relatively large external magnetic field can be directly transferred to the field sensors inside the shield, and can be non-uniformly summed with the torque-induced magnetic fields, corrupting the torque measurement. This means that there is no totally effective way to protect or shield external magnetic fields propagating through the shaft with current techniques.

An additional disadvantage of the shielding method is that any deformation of the shield device caused by mechanical impact or extreme temperature change can affect the relative position of the field sensors and the shield, which can lead to unbalancing of far field values between two sensor fields operating in pairs that are oppositely oriented. This would result in compassing failure.

Furthermore, in most torque sensor applications, packaging space is limited, and in many cases there is no room for a shield or flux director. In addition, the added financial cost for those components is not insignificant because materials with high permeability tend to have high percentages of nickel, the pricing of which is quite volatile.

One of the major challenges consists in measuring torque in a shaft having external magnetic fields down to very low frequencies. The above prior art solutions are generally not suitable to eliminate disturbances from magnetic fields at very low frequencies down to almost constant values (DC-values).

Based on the foregoing, there is a need for a new and better technique for effectively canceling the effects of non-torque dependent magnetic fields.

SUMMARY

In one aspect of the invention a torque sensor is provided which comprises an at least partially hollow longitudinally extending member (for example a hollow shaft). The at least partially hollow longitudinally extending member has a cavity with an inner surface. The member comprises a magnetoelastically active region that is effective at the inner surface of the at least partially hollow longitudinally extending member (i.e. inside the cavity). The effects of the magnetoelastically active region are detectable by magnetic field sensors at the inner surface (inside) the member. The active region can be configured in such a manner that torque applied to the member is proportionally transmitted to the active region. The active region comprises at least one region magnetically polarized such that the magnetized polarity becomes increasingly helically shaped as the applied torque increases. A plurality of primary magnetic field sensor is arranged approximate the at least one region for outputting a first signal corresponding to a torque-dependent magnetic flux emanating from the active region. At least one secondary magnetic field sensor is axially spaced in a first direction by a pre-determined first distance from the plurality of primary magnetic field sensors for outputting a second signal corresponding to an ambient magnetic flux emanating from a near magnetic field source. At least one secondary magnetic field sensor is axially spaced in a second direction opposite the first direction by pre-determined second distance from the plurality of primary magnetic field sensors for outputting a third signal corresponding to the ambient magnetic flux emanating from the near magnetic field source. There is also a means for adjusting the first signal using the second and the third signals thereby compensating for the effects of the near magnetic field source. The primary and secondary magnetic field sensors are arranged inside the longitudinally extending member (i.e. inside the cavity of the longitudinally extending member).

Aspects of the invention are directed to the cancellation of external magnetic fields by placing at least four magnetic field sensors inside an at least partially hollow longitudinally extending member (for example a shaft) and close to magnetic regions conditioned so as to be detectable at the inner surface of the shaft. The magnetic regions on the shaft can advantageously consist of three sections: central region, right side region, and left side region. A first or primary set of magnetic field sensors is located close to the central region. At least one secondary magnetic field sensor is located close to the right side region. At least one secondary magnetic field sensor is located close to the left side region.

Although shielding is generally considered insufficient to protect or shield external magnetic fields propagating through the shaft, the present invention has the surprising effect that the effects of the near magnetic field are canceled out to a higher extent than with external magnetic field sensors. In particular, the torque sensor according to the aspects of the invention is suitable to suppress disturbances of magnetic fields having very low frequencies down to 0 Hz (DC). The additional disadvantage of the shielding method according to which any deformation of the shield device caused by mechanical impact or extreme temperature change can result in compassing failure is irrelevant, as the shaft is—inherently—conceived not to deform under the normal operating conditions. Furthermore, additional packaging space is not required.

The at least partially hollow longitudinally extending member can at least partially be formed of any material that is suitable for producing the magnetoelastic effect. The material of the member can be a ferromagnetic material suitable for providing the magnetoelastic effect. The material can contain Ni.

In an aspect of the invention, at least some of the field sensors (or all of them) can be arranged on a board, in particular a printed circuit board (PCB). This aspect provides an (automatic) alignment of the magnetic field sensors with respect to each other and with respect to the magnetic regions of the longitudinally extending member.

Beyond a certain distance between the near field source and the sensors, a magnetic field from an external near field source(s) decreases in a substantially linear fashion in relation to the distance from the external near field source. Magnetic field sensors placed closest to the external near field sources detect the largest near field value, magnetic field sensors placed farthest from external near field source detect the smallest near field value, and magnetic field sensors in the center sense an average value of the nearest and farthest sets of magnetic field sensors. The magnetic field sensors at the central region have opposite sensing polarity to the magnetic field sensors at the right side and left side regions. Thus, the near field measured by the primary magnetic field sensors at the central region is the same magnitude and opposite sign from the averaged values of the near field measured by the secondary magnetic field sensors at the right and left regions. The interconnects to the field sensors in combination with the associated electronics are configured so as to average the values of the left and right side regions and sum that average with the value of the center region sensor which, because it is oriented with an opposite polarity, effectively cancels the effects of the near field measurement error. An arrangement using three magnetized regions as previously described is also referred to as "tri-band torque sensor."

While the near field is cancelled out, the torque induced magnetic field measured by the primary and secondary magnetic field sensors is not cancelled out because the output of the center region, or primary sensor, is a differential measurement with respect to the left and right region sensors.

In addition to the use of the three contiguously magnetized regions as disclosed above, this arrangement of field sensors can be applicable to any number of magnetized regions on the shaft. For example, if this arrangement is applied to single magnetized region, the magnetic field sensors at the central primary region are placed proximate to the center of the single region. Magnetic field sensors located to the right and left side of the single magnetized region detect only the near field because the absence of magnetic polarization proximate to those secondary sensors results in the absence of a torque induced magnetic field.

According to an aspect of the invention, the at least one region is magnetized so that all of the domain magnetizations in the region lie within at most a plus or minus 45° limit of a circumferential direction of the member.

The magnetic field sensors can be vector sensors. The magnetic field sensors (vector sensors) can be one of a Hall effect, magnetoresistance, magnetotransistor, magnetodiode, MAGFET field sensors, or fluxgate magneto meter. Advantageously, all of the magnetic field sensors of an embodiment of the invention use the same type of sensor.

The elongate member can be a shaft incorporated in an on-road or off-road vehicle, a ship, an industrial process, consumer products (washing machines, bicycles, e-bikes etc).

The pre-determined first and second distances can be substantially the same.

The pre-determined first and second distances can be such that an average of the second and third signals approximates the value of the ambient magnetic flux present at the location of the at least one primary magnetic field sensor.

The torque sensor can comprise two primary magnetic field sensors, one secondary magnetic field sensor axially spaced in the first direction; and one secondary magnetic field sensor axially spaced in the second, opposite direction.

One of the primary magnetic field sensors and one of the secondary magnetic field sensors can be arranged on one side of the cavity of the longitudinally extending member (inside the cavity of the hollow member), and wherein the other of the primary magnetic field sensors and the other of the secondary magnetic field sensors can be arranged on an opposite side of the cavity of the member.

The torque sensor can comprise eight magnetic field sensors. The eight magnetic field sensors may then comprise four primary magnetic field sensors; two secondary magnetic field sensors axially spaced in the first direction; and two secondary magnetic field sensors axially spaced in the second, opposite direction.

According to another aspect, four primary magnetic field sensors can be radially aligned with respect to the longitudinally extending member. Two secondary magnetic field sensors can be axially spaced in a first direction by a pre-determined first distance from the plurality of primary magnetic field sensors; and two secondary magnetic field sensors can be axially spaced in the second direction opposite the first direction by a pre-determined second distance from the plurality of primary magnetic field sensors.

The two primary magnetic field sensors and two secondary magnetic field sensors can be mounted on a first side of a board (a printed circuit board, in particular a single printed circuit board), and the other two primary and two secondary magnetic field sensors can be mounted on the second, opposite side of the board.

The positions of the two primary field sensors on the first side of the board can entirely (exactly) overlap (coincide; match) with the positions of the two primary magnetic field sensors on the second side of the board.

In other words, the primary field sensors can be arranged such that primary field sensors on opposite sides of the board have entirely overlapping positions. A primary field sensor on a first side of the board (front side) can be in exactly the same position on the board as another primary field sensor on the opposite side. Each of the secondary field sensors can be axially (axial direction of the longitudinally extending member) aligned with one of the primary field sensors in a position without another secondary field sensor on the opposite side of the board.

The magnetic field sensors can advantageously be arranged symmetrically with respect to a horizontal axis of reflection and a vertical axis of reflection both lying in the plane of the board and crossing each other in the geometrical gravity center of the magnetic field sensors (all magnetic field sensors).

The distance (axial spacing) between a primary field sensor and a secondary field sensor in axial direction can be 20 mm or less. The distance relates to the centers of the field sensors. An advantageous distance between a primary field sensor and a secondary field sensor in axial direction can also be 10 mm or less and more advantageously 9.5 mm. If the sensors are arranged having the indicated distances or less, the noise from near field noise source can be further reduced.

The distance between two primary field sensors in radial direction depends on the diameter of the cavity inside the hollow shaft. In an advantageous embodiment the radial distance can be equal to or lower than 30 mm.

The active region can comprise two axially-spaced regions, the first being magnetized in a first substantially circumferential direction and the other being magnetized in a second substantially circumferential direction opposite the first direction in such a manner that the torque applied to the member is proportionally transmitted to the active region, and wherein the at least one secondary magnetic field sensor axially spaced in the first direction is proximate one of the regions, and wherein the at least one secondary magnetic field sensors axially spaced in the second, opposite direction is proximate the other region.

The active region can comprise three axially-spaced regions, the middle region being magnetized in a first substantially circumferential direction and the outer regions being magnetized in a second substantially circumferential direction opposite the first direction in such a manner that the torque applied to the member is proportionally transmitted to the active region, and wherein the at least one secondary magnetic field sensors axially spaced in the first direction is proximate one of the outer regions, and wherein the at least one secondary magnetic field sensor axially spaced in the second, opposite direction is proximate the other outer region.

The primary and secondary magnetic field sensors can be oriented in an axial direction of the longitudinally extending member.

The primary and secondary magnetic field sensors can be oriented normally to the inner surface of the longitudinally extending member.

The primary and secondary magnetic field sensors can be oriented substantially normally to the surface of the member at the respective boundaries between the regions.

In case of application to a three region magnetized shaft (tri-band), the magnetic field sensors at the central region and magnetic field sensors at right side and left side regions measure both near field and torque induced magnetic field. The near field is cancelled out and torque induced magnetic field is measured.

Briefly described, those and other objects and advantages of the present invention are accomplished, as embodied and fully described herein, by a method for reducing the noise in a signal from a torque sensor caused by near magnetic field sources, the method including the steps of providing a torque sensor, receiving a first primary signal upon the application of a torque; receiving a second and a third secondary signal; and adjusting the first signal using the second and third signals thereby compensating for the effects of the near magnetic field source.

The torque sensor can include an at least partially hollow longitudinally extending member; a magnetoelastically active region directly or indirectly attached to/or forming a part of the inner surface of the member, the active region having at least one region magnetized in a first substantially circumferential direction in such a manner that torque applied to the member is proportionally transmitted to the active region; a plurality of primary magnetic field sensors arranged proximate the at least one region for outputting a first signal corresponding to a torque-dependent magnetic flux emanating from the active region; at least one secondary magnetic field sensor axially spaced in a first direction by a pre-determined first distance from the plurality of active magnetic field sensors for outputting a second signal corresponding to an ambient magnetic flux emanating from the near magnetic field source; at least one secondary magnetic field sensor axially spaced in a second direction opposite the first direction by the pre-determined first distance from the plurality of active magnetic field sensors for outputting a third signal corresponding to the ambient magnetic flux emanating from the near magnetic field source.

The invention also provides a method for reducing the noise in a signal from a torque sensor caused by near magnetic field sources. A torque sensor is provided that is configured as previously described. A first signal is received upon the application of the torque. Second and third signals are received. The first signal is adjusted using the second and third signals thereby compensating for the effects of the near magnetic field source.

In one aspect of the invention, there is a torque sensor which comprises a longitudinally extending member, a magneto-elastically active region in such a manner that torque applied to the member is proportionally transmitted to the active region, the active region comprising at least one region magnetically polarized such that the magnetized polarity becomes increasingly helically shaped as the applied torque increases; at least four primary magnetic field sensors arranged approximate the at least one region and radially aligned with respect to the longitudinally extending member for outputting signals corresponding to a torque-dependent magnetic flux emanating from the active region; at least two secondary magnetic field sensors axially spaced in a first direction by a pre-determined first distance from the plurality of primary magnetic field sensors outputting signals corresponding to an ambient magnetic flux emanating from a near magnetic field source; at least two secondary magnetic field sensors axially spaced in a second direction opposite the first direction by a pre-determined second distance from the plurality of primary magnetic field sensors outputting signals corresponding to an ambient magnetic flux emanating from a near magnetic field source. Two primary magnetic field sensors and two secondary magnetic field sensors can then be mounted on a first side of a circuit board, and the other two primary and two secondary magnetic field sensors can be mounted on a second, opposite side of the board. The relative positions of the magnetic field sensors are then automatically aligned with respect to each other. Furthermore, the field sensors are substantially arranged in one (the same) plane which supports noise cancelation. The magnetic field sensors can then be arranged substantially symmetrically with respect to a horizontal axis of reflection and a vertical axis of reflection both lying in the plane of the circuit board and crossing each other in the geometrical gravity center of the magnetic field sensors. The advantages of this aspect of the invention can also be achieved, if the magnetic field sensors are not arranged inside the longitudinally extending member.

According to an aspect of the invention, there is an apparatus that consists of a hydraulic power unit such as a hydraulic pump, motor, or transmission comprising a non-contact torque transducer. The unit is an integral part thereof, usually at the time of manufacture. Additionally, the invention relates to a method for integrating a circularly magnetized torque transducer into such a hydraulic unit. The invention further relates to the integration of both a torque sensor and a speed sensor into such a hydraulic power unit.

The torque sensor is configured according to the aspects of the invention as described in this specification. Such a device is capable of sensing the torque in the shaft of a hydraulic power unit such as a hydrostatic pump or motor, and may optionally be adapted for sensing the speed of rotation or instantaneous rotational position of such a unit. A control system that is capable of sensing the measurement of the torque transducer, and possibly other information may optionally be used to control the torque on a hydraulic power unit. As this additional information concerning torque and speed of a hydraulic power unit is measured, improved control and other improvements result.

The signals obtained from the torque sensor can be used to limit the torque of a hydraulic power unit. Torque may be limited for the purpose of protecting a load from damage or preventing the stalling of an internal combustion engine. The signals can also be used for enhanced control. Measured torque information is useful in various control schemes which are sometimes designed to enhance traction and reduce or prevent wheel slippage, or for other purposes.

The invention also provides a divided roll stabilizer comprising a torque sensor according to the aspects of the invention. Accordingly, the torsion in the divided roll stabilizer can be converted into a magnetic signal. The roll stabilizer can comprise an actuator and connecting parts in which the torque sensor can be integrated. Therefore, the connecting parts can be at least partially hollow. The torsion of the connecting part can then generate a magnetic signal that is dependent on the applied torsion. The connecting part provides the transmission of the effective torsion between the actuator that can be connected and the connected stabilizer part. Furthermore, the connecting part can generate a magnetic signal that is dependent on an applied torsion. The measured torsion can be used as a measurement variable for a control device, in order to activate the actuator that can be connected selectively.

The connecting part can comprise a flange that can be, on one side, connected to the actuator or locked in rotation with the actuator and, on the other side, can be locked in rotation with the stabilizer part. If the stabilizer part is constructed, for example, as a rod-shaped torsion bar spring, the end of the stabilizer part facing the actuator can be inserted into a receptacle of the flange and locked in rotation with this flange.

The actuator can be arranged effectively between the two stabilizer parts, in order to introduce a generated torsion, on one side, into one stabilizer part and, on the other side, into the other stabilizer part.

The connection parts can be compact, one-piece components. The connecting parts can be formed of any material that is suitable for magnetoelastic effects. For example, the connecting parts can be formed of ferromagnetic steel that is suitable for magnetoelastic effects. The connecting parts can be formed of industrial steel that contains between 1.5% and 8% Ni or of 20 Cr13 or similar steel.

In an embodiment of the invention, the stabilizer parts are supported in stabilizer bearings and each provided with a connecting part for connecting to an actuator. The stabilizer bearing supports the stabilizer part on the vehicle body and allows rotational movements of the stabilizer part about the axis of torsion.

The otherwise provided connecting part can be produced from magnetoelastic material and can be magnetized and is thus suited according to the invention for a non-contact detection of an effective torsion. A separate primary sensor that changes its magnetic properties under a torsion is not needed.

If the connecting part is constructed as a flange, one option is for the flange to have a hollow construction. Such a flange is lighter by weight compared with solid flanges. The secondary sensor could be arranged in the hollow flange, so that additional installation space requirements for the secondary sensor are eliminated.

However, the arrangement inside the at least partially hollow longitudinally extending member (for example hollow flange or hollow shaft) also provides additional unexpected advantages and in particular a much better noise immunity with respect to magnetic field sources. If the magnetic field sensors arranged inside the at least partially hollow longitudinally extending member, they can be placed closer together, while their relative distance with respect to the magnetically active regions on the member can remain the same. The member provides an additional shielding effect, but is inherently stable. Furthermore, all the field sensors can be mounted on a printed circuit board (PCB), thereby providing an automatic alignment of the magnetic field sensors with respect to each other and with respect to the magnetically active region of the member.

BRIEF DESCRIPTION OF DRAWINGS

Further aspects and characteristics of the invention ensue from the following description of the preferred embodiments of the invention with reference to the accompanying drawings, wherein.

DETAILED DESCRIPTION OF AN EXAMPLE EMBODIMENT

Figure 1:
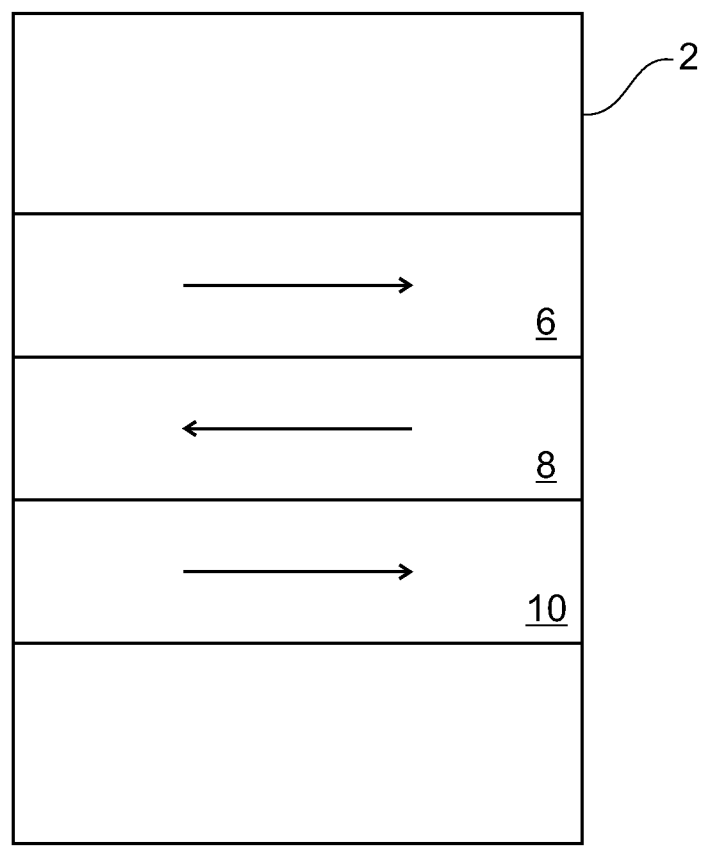
FIG. 1 is a schematic diagram showing the placement of circumferentially magnetized regions on a hollow shaft according to an embodiment of the invention.

FIG. 1 is a schematic diagram showing a hollow or partially hollow shaft 2 having three magnetized regions 6, 8, 10 according to an embodiment of the invention. The shaft 2 is magnetically conditioned so as to provide the regions 6, 8, 10, having remanent circumferential magnetizations in the shaft 2. The arrows indicate the direction of the circumferential magnetization. In this embodiment, regions 6 and 10 have the same direction, and region 8 which is in the middle has a magnetization in the opposite direction.

Figure 2:
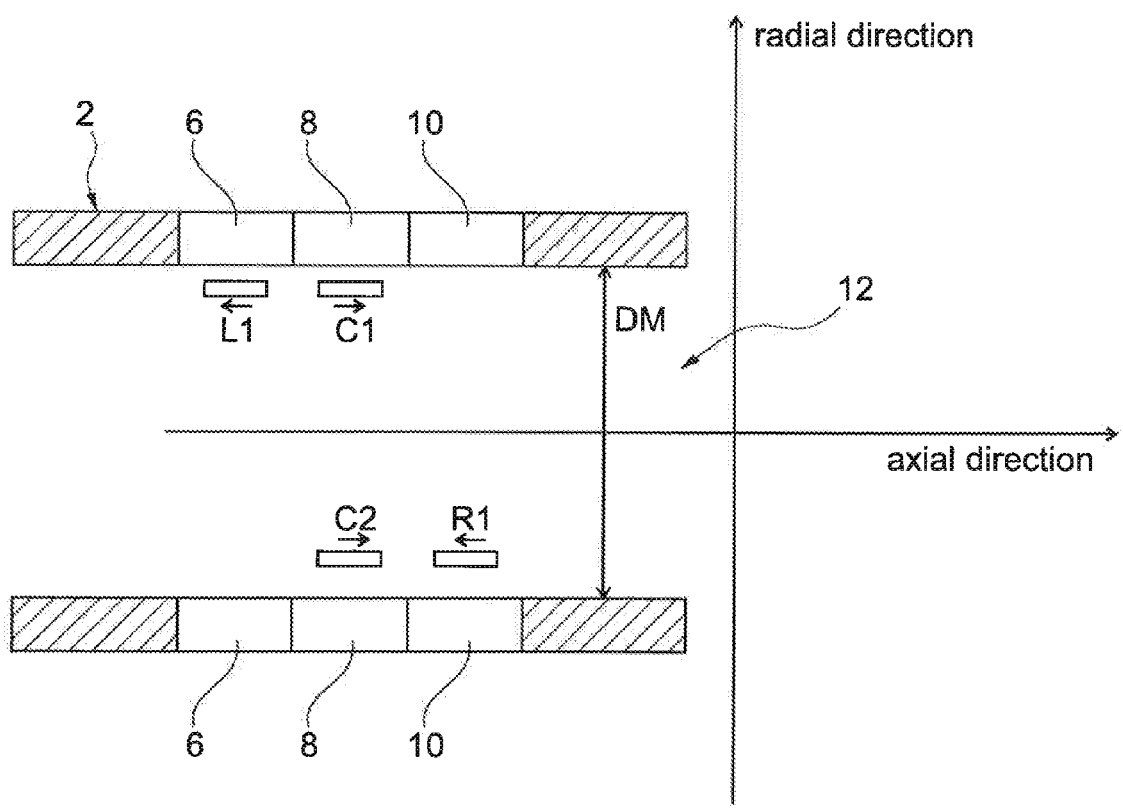
FIG. 2 is a schematic diagram showing the placement of magnetic field sensors inside a hollow shaft having three magnetic regions according to an embodiment of the invention.

FIG. 2 is a schematic diagram showing the placement of primary magnetic field sensors C1 and C2 and secondary magnetic field sensors R and L inside the hollow shaft 2 (longitudinally extending member) having three magnetized regions 6, 8, 10. The shaft 2 has a cavity 12 in which the sensors C1, C2, R and L can be arranged. The primary and secondary magnetic field sensors C1, C2, R and L are placed close to the inner surface of the shaft 2 (i.e. the inner surface the cavity 12).

The axial directions and radial directions are indicated as they are used in the context of this specification. Furthermore, the inner diameter DM of the hollow shaft 2 (i.e. the diameter of the cavity 12) is also indicated.

The shaft 2 can be magnetically conditioned using magnets (not shown) or current, thereby forming the regions 6, 8, 10, having remanent circumferential magnetizations in the shaft 2. The magnets are advantageously externally applied to the shaft 2 for magnetically conditioning the shaft 2. The circumferential magnetization is advantageously conditioned to penetrate (being present through) the entire mantle/shell of the hollow shaft such that the magnetoelastic effects of the active magnetic regions can be detected at the inner surface of the shaft 2 (cavity 12).

The primary magnetic field sensors C1 and C2 measure the torque-induced magnetic field and the magnetic near field emanating from the center region 8. The secondary field sensors R and L, at the respective right and left side of the primary field sensors C1 and C2 measure the torque-induced magnetic fields emanating from the right region 10 and left region 6 of the shaft, respectively, as well as the magnetic near fields at those locations. While the magnetic near field measured by the secondary field sensors R and L is canceled out by the magnetic near field as measured by the primary field sensors C1 and C2 (because they are oppositely oriented), the torque-induced magnetic fields seen by field sensors C1 and C2 are not canceled out by the values measured by the secondary field sensors R and L. Actually, the torque-induced magnetic fields are additive due to the oppositely polarized magnetization between the center region 8 and the regions 6 and 10. The unwanted magnetic near field is cancelled out, and only the torque-induced magnetic field is seen by the primary field sensors C1, C2 at the center region 8. The torque-induced magnetic fields emanating from side regions 6 and 10 are doubled by adding the values from the secondary field sensors R and L. The actual computation of the net near field effect value and the net torque-induced field value can be performed by an arithmetic logic unit (ALU).

Figure 3:
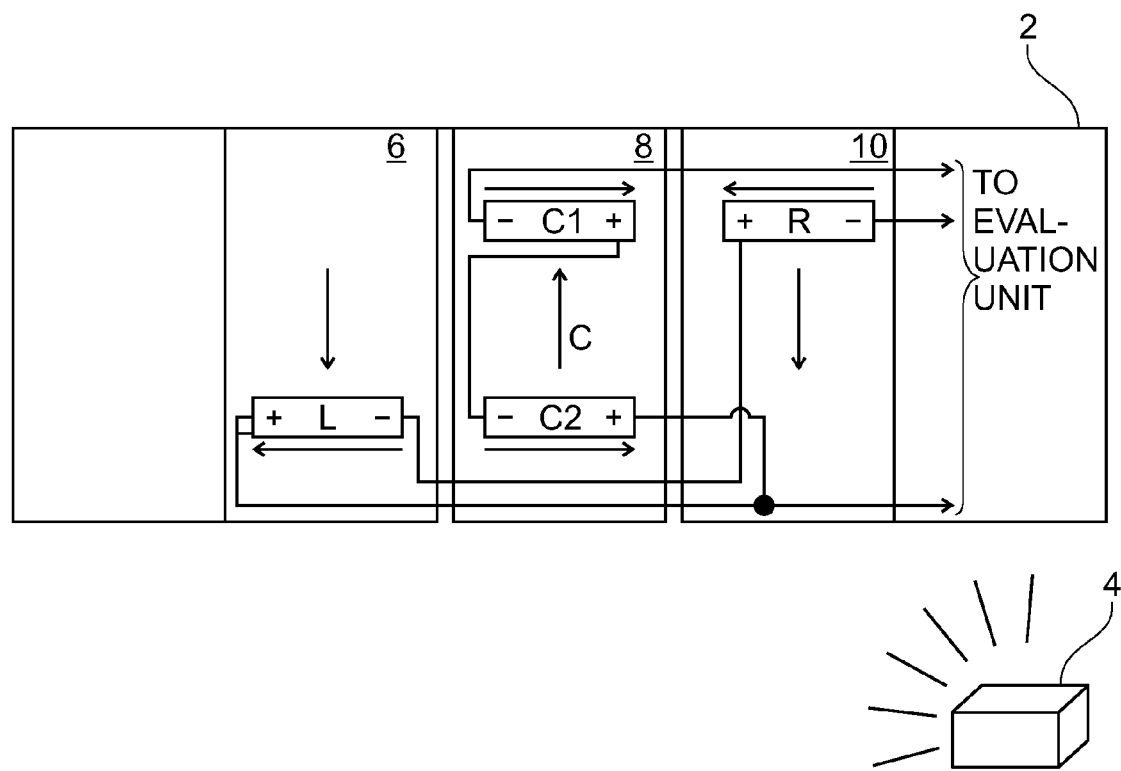
FIG. 3 is a schematic diagram showing the placement and interconnection of magnetic field sensors according to an embodiment of the invention.
Figure 4:
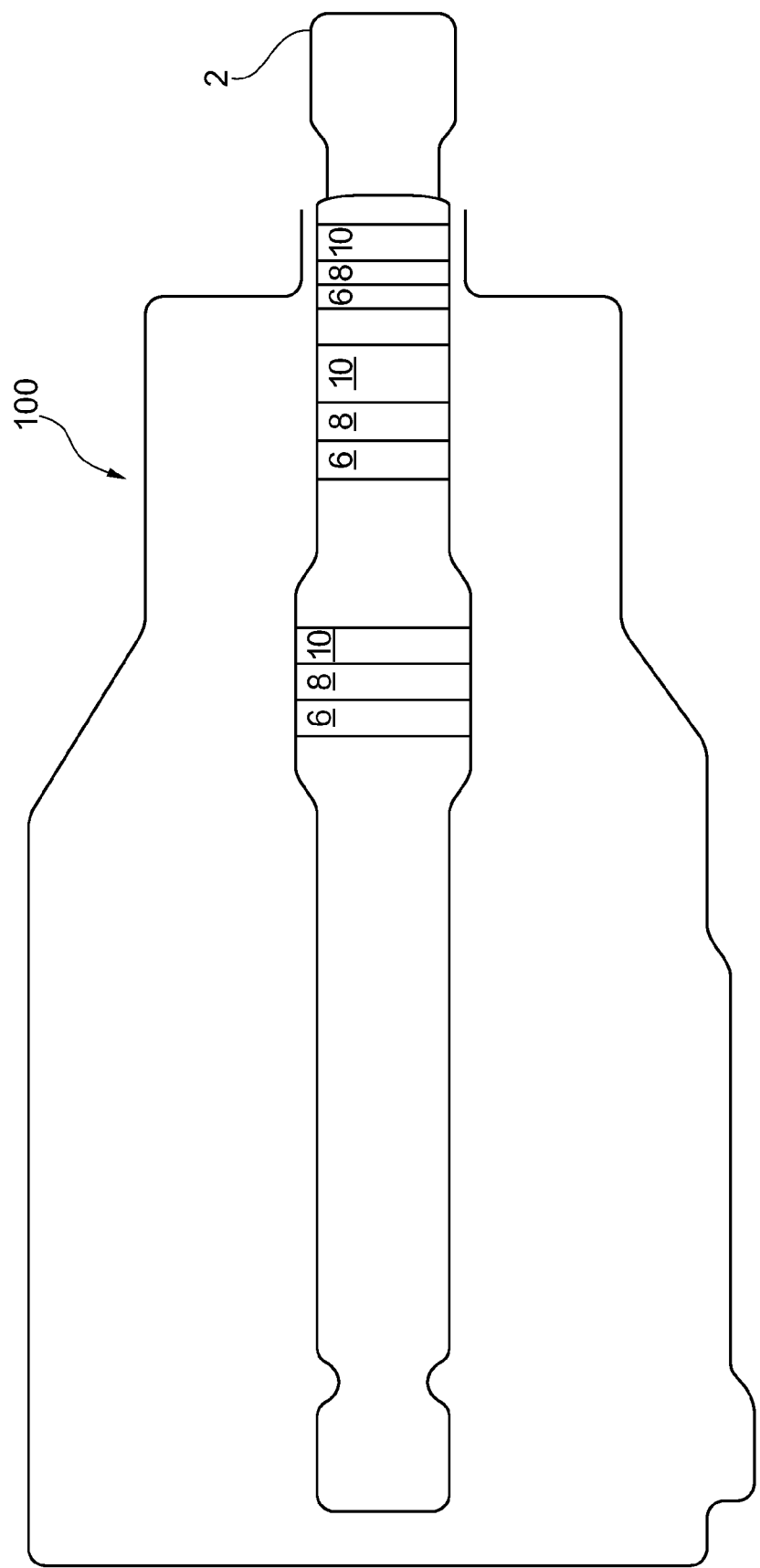
FIG. 4 is a cross sectional view of an axial piston hydraulic power unit with non-contact torque transducers integrated at three different locations according to an embodiment of the invention.

FIG. 3 is another schematic diagram showing the placement of primary magnetic field sensors C1 and C2 and secondary magnetic field sensors R and L inside the shaft 2 having three magnetized regions 6, 8, 10, according to an embodiment of the invention.

This embodiment is based on the cancellation of external magnetic fields by placing at least four magnetic field sensors inside an at least partially hollow longitudinally extending member (for example a shaft) and close to magnetic regions conditioned so as to be detectable at the inner surface of the shaft. The magnetic regions on the shaft consist of three sections: central region 8, right side region 10, and left side region 6. The first or primary set of magnetic field sensors is located close to the central region 8. At least one secondary magnetic field sensor R is located close to the right side region 10. At least one secondary magnetic field sensor L is located close to the left side region 6.

The at least partially hollow longitudinally extending member can at least partially be formed of any material that is suitable for producing the magnetoelastic effect. The material of the member can be a ferromagnetic material suitable for providing the magnetoelastic effect. The material can contain Ni.

At least some of the field sensors (or all of them) can be arranged on a board, in particular a printed circuit board (PCB). This aspect provides an (automatic) alignment of the magnetic field sensors with respect to each other and with respect to the magnetic regions of the longitudinally extending member.

The magnetic field sensors C1, C2 at the central region 8 have opposite sensing polarity to the magnetic field sensors L, R at the right side 10 and left side 6 regions. Thus, the near field measured by the primary magnetic field sensors at the central region is the same magnitude and opposite sign from the averaged values of the near field measured by the secondary magnetic field sensors L, R at the right and left regions 10, 6.

There is also a near field source 4, which can be any source of a magnetic field. In this diagram it is also shown how the magnetic field sensors can be coupled. The first primary field sensor C1 is coupled with a positive terminal to the negative terminal of the second primary field sensor C2. The positive terminal of the first secondary magnetic field sensor R is coupled to the negative terminal of the second secondary magnetic field sensor L. The positive terminal of the second secondary magnetic field sensor L is coupled to the positive terminal of the second primary magnetic field sensor C2. The negative terminal of the first primary field sensor C1, the negative terminal of the first secondary field sensor R and the positive terminals of the second primary and the second secondary field sensors are coupled to a means for evaluating the signals in order to compensate for the effects of the near magnetic field source (i.e. these signals are fed to an evaluation stage (not shown)). This evaluation stage or parts of this stage can be located inside the shaft 2 or outside the shaft 2 (i.e. inside or outside the cavity 12 of the shaft 2).

The center C indicates the location of the point of symmetry of this arrangement. The symmetry with respect to this point C already provides a good noise reduction.

The interconnects to the field sensors in combination with the associated electronics are configured so as to average the values of the left 6 and right side 10 regions and sum that average with the value of the center region sensors C1, C2 which, because it is oriented with an opposite polarity, effectively cancels the effects of the near field measurement error. This arrangement using three magnetized regions also referred to as "tri-band torque sensor."

While the near field is cancelled out, the torque induced magnetic field measured by the primary and secondary magnetic field sensors is not cancelled out because the output of the center region, or primary sensor, is a differential measurement with respect to the left and right region sensors.

In one embodiment, the torque sensor according to the aspects and embodiments of the invention can advantageously be used in a variable displacement axial piston hydraulic power unit (not shown). The general operation of such an axial piston power unit is widely known and is therefore not further described here. The torque measurement according to the invention can be integrated into the unit at three locations. The circumferentially magnetized regions (for example three or more, as previously described) can be arranged at different locations. For example, the hydraulic power unit comprises a splined shaft. The splined shaft serves to couple the hydraulic power unit to an external source of mechanical power (for example a combustion engine (not shown)). Such a shaft alternatively provides a means for a hydraulic power unit to be connected to the load or device which requires mechanical power, such as a wheel. It is desirable to sense torque within a hydraulic power unit in the splined shaft using the torque sensor in accordance with the aspects of the invention. If the arrangement shown in FIG. 5 is used, it is also possible to arrange the sensor outside the flange and achieve acceptable noise suppression.

Another advantageous embodiment of the invention is a divided roll stabilizer for a motor vehicle (not shown). In a divided roll stabilizer, the actuator is arranged effectively between two stabilizer parts constructed as torsion bar springs. Both stabilizer parts are supported so that they can rotate by means of a stabilizer bearing on a vehicle body. The actuator can have a motor with a connected gear, wherein an actuator housing can be connected to one stabilizer part and an output shaft can be connected to the other stabilizer part. Under activation of the actuator the connected stabilizer parts are loaded in torsion. The torque sensor according to the aspects of the invention can then integrated into the hollow flange of the stabilizer part for non-contact measurement of the actuator moment. The flange comprises the at least three circumferentially magnetized regions. The flange can be made from magnetoelastic material in order to have at least one, and advantageously three magnetic regions. The primary field sensors and the secondary field sensors can be arranged in the hollow flange in accordance with the aspects and embodiments of the invention. With the arrangement of the field sensors inside the hollow flange, it is possible to suppress the effects of any near field source to a maximum. If the arrangement shown in FIG. 5 is used, it is also possible to arrange the sensor outside the flange and achieve acceptable noise suppression.

Figure 5:
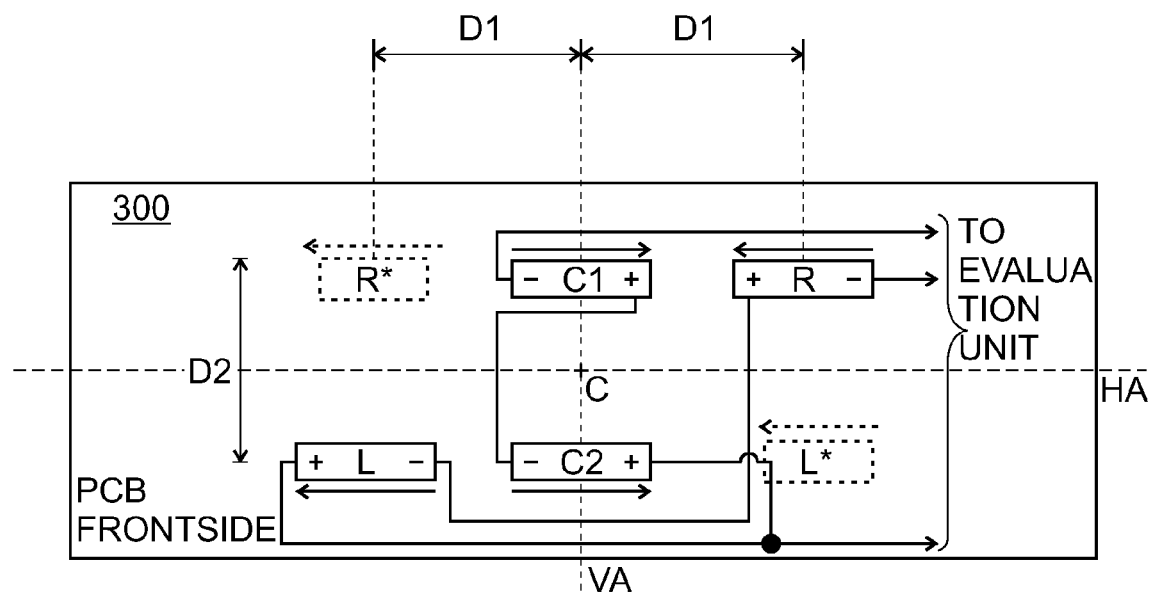
FIG. 5 is a schematic diagram of an embodiment of the invention.
Figure 5:
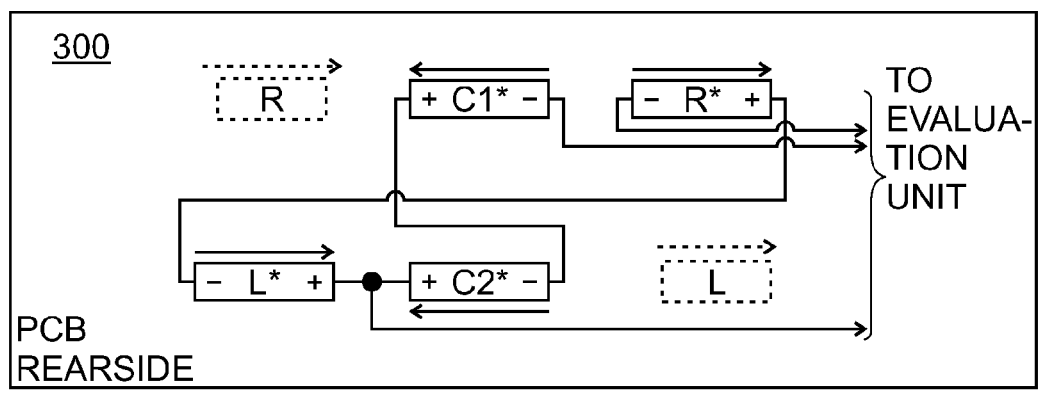

FIG. 5 is a schematic diagram of an embodiment of the invention. The magnetic field sensors are mounted on a board 300, in particular on a printed circuit board (PCB) 300. Due to the aspect of the invention that the magnetic field sensors are arranged inside the at least partially hollow longitudinally extending member (for example in the hollow shaft 2 in the previous embodiments), it is easily possible to mount the magnetic field sensors on a single board (PCB) 300. One of the advantages of this arrangement is that the magnetic field sensors are automatically placed in the required relative positions when they are mounted on the board 300. The board carrying the magnetic field sensors can then be inserted into the hollow shaft, so that each of the magnetic field sensors assumes the correct and exact absolute and relative position with respect to the active regions of the hollow longitudinally extending member and with respect to the other magnetic field sensors.

It is generally possible to use four magnetic field sensors C1, C2 (two primary magnetic field sensors) and L and R (two secondary magnetic field sensors as shown for example in FIG. 3: However, in an advantageous embodiment, it also possible to use eight magnetic field sensors C1, C2, L, R, C1*, C2*, L*, and R*. The previously mentioned four magnetic field sensors C1, C2, L and R can then be placed on the front side of the board 300. The other four magnetic field sensors C1*, C2*, L* and R* can be placed on the rear side of the board 300. The primary sensors C1 and C1* can then be perfectly aligned so that C1 and C1* are placed in exactly the same positions on opposite sides of the board 300. The primary sensors C2 and C2* can also be perfectly aligned so that C2 and C2* are placed in exactly the same positions on opposite sides of the board 300. The secondary sensors L, R, L* and R* are advantageously arranged as shown in FIG. 5.

The upper schematic diagram shows the front side of the board 300. The lower schematic diagram shows the rear side of the board 300. In the lower schematic diagram, the board 300 is rotated by 180° around the vertical axis of reflection VA indicated in the upper schematic diagram. The dotted lines indicate the positions of the secondary magnetic field sensors R* and L* on the opposite side (rear side) of the board 300. In the same way, the dotted lines in the lower schematic diagram which shows the rear side of the board 300 indicate the positions of the secondary magnetic field sensors L and R on the front side. The primary magnetic field sensors of the respective opposite sides of the board 300 are not indicated by dotted lines as they are fully covered by the shown primary magnetic field sensors. The primary magnetic field sensors exactly coincide on the respective opposite sides of the board 300. The secondary magnetic field sensors are also aligned with the other sensors in horizontal and vertical direction, but they are mounted in locations without secondary magnetic field sensors on the opposite side of the board.

The primary and secondary magnetic field sensors C1, C2, L, R, C1*, C2*, L* and R* are arranged symmetrically with respect to the vertical axis of reflection VA and the horizontal axis of reflection HA. The vertical axis of reflection VA and horizontal axis of reflection HA lie in the plane of the board 300. The vertical axis of reflection VA and horizontal axis of reflection HA have a crossing point C in the center of the arrangement. C substantially indicates the geometric gravity center of the magnetic field sensors C1, C2, L, R, C1*, C2*, L* and R*. Due to this double symmetry, the noise suppression is improved compared with the point symmetry of the embodiment shown in FIG. 3 having only four magnetic field sensors. As each set of four magnetic field sensors is arranged on a different side of the board, the magnetic field sensors do not perfectly lie in one plane. However, this minor deviation can be neglected with respect to noise cancellation. In the context of this specification with respect to noise cancellation, they are regarded as if they are actually in the same plane.

The major advantage of this embodiment is that the relative positions of the four secondary magnetic field sensors R, L, R*, L* with respect to any near field magnetic source (noise source) improve the possibility to cancel out the noise. The additional two secondary field sensors L* and R* are placed at the two locations where no secondary field sensor is placed in the embodiment of FIG. 3. However, in order provide good differential signals, two additional primary sensors C1*, C2* are also required. They are advantageously placed directly at the same locations as the two primary sensors C1 and C2, but on the opposite side of the board 300.

As previously discussed with respect to noise cancellation, all eight magnetic field sensors are considered to lie in the same plane (the thickness of the board and the fact that the magnetic field sensors may protrude in opposite directions from the different sides of the board is neglected).

In another embodiment, it is therefore also possible to mount the secondary magnetic field sensors R* and L*, or at least one of them, on the same side of the board 300 as the secondary magnetic field sensors R and L.

The magnetic field sensors on the front side of the board 300 can be coupled to each other as previously described with respect to FIG. 3. The magnetic field sensors on the rear side of the board 300 can also be coupled to each other as previously described with respect to FIG. 3. Before the signals of the sensors are fed to an evaluation stage, the signals coming from the different sides of the board can also be coupled to each other (not shown).

The distances D1 between the primary sensors and the respective axially adjacent secondary field sensors are also indicated (axial direction as indicated in FIG. 2). This distance can be equal to or lower than 20 mm, 10 mm and in particular 9.5 mm. The distance between the magnetic field sensors in radial direction (radial as indicated in FIG. 2) depends on the diameter of the cavity in the hollow longitudinally extending member. An advantageous radial distance—advantageous in terms of noise reduction—is equal to or lower than 3 cm.

Similar to the embodiment of FIG. 3, the shaft (longitudinally extending member) can advantageously have three magnetized regions 6, 8, 10 (not shown but similar to the embodiment of FIG. 3).

Also this embodiment is based on the cancellation of external magnetic fields by placing at least eight magnetic field sensors inside an at least partially hollow longitudinally extending member (for example a shaft) and close to magnetic regions conditioned so as to be detectable at the inner surface of the shaft. The magnetic regions on the shaft advantageously consist of three sections: central region, right side region, and left side region. The first or primary set of magnetic field sensors is located close to the central region. Two secondary magnetic field sensors R, R* are located close to the right side region. Two secondary magnetic field sensor L, L* are located close to the left side region.

The longitudinally extending member can at least partially be formed of any material that is suitable for producing the magnetoelastic effect. The material of the member can be a ferromagnetic material suitable for providing the magnetoelastic effect. The material can contain Ni.

The magnetic field sensors C1, C2; C1*, C2* at the central region have opposite sensing polarity to the magnetic field sensors L, L*, R, R* at the right side 10 and left side 6 regions. Thus, the near field measured by the primary magnetic field sensors at the central region is the same magnitude and opposite sign from the averaged values of the near field measured by the secondary magnetic field sensors at the right and left regions.

The interconnects to the field sensors in combination with the associated electronics are configured so as to average the values of the left and right side regions and sum that average with the value of the center region sensors C1, C2, C1*, C2* which, because it is oriented with an opposite polarity, effectively cancels the effects of the near field measurement error. This arrangement using three magnetized regions is also referred to as "tri-band torque sensor."

While the near field is cancelled out, the torque induced magnetic field measured by the primary and secondary magnetic field sensors is not cancelled out because the output of the center region, or primary sensor, is a differential measurement with respect to the left and right region sensors.

The embodiment using eight magnetic field sensors as previously described can advantageously be used for the variable displacement axial piston hydraulic power unit and the divided roll stabilizer as described herein.

Some advantages of this embodiment can also be achieved, if the magnetic field sensors (i.e. the board 300 carrying the field sensors) are not arranged inside a longitudinally extending member, but outside the longitudinally extending member.

Figure 6:
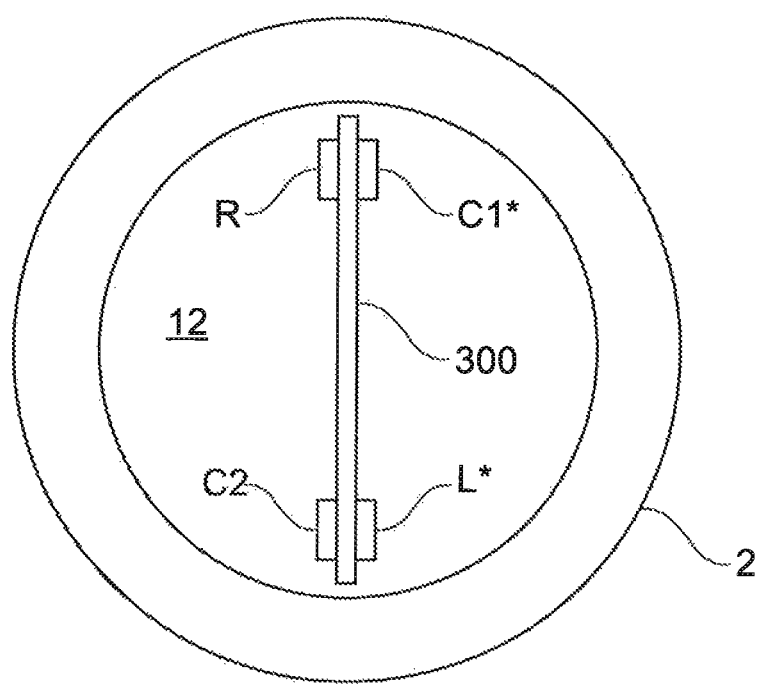
FIG. 6 is a cross sectional view of an embodiment of the invention.

FIG. 6 shows a simplified cross sectional view of an embodiment of the invention. In this embodiment, the previously described board 300 is placed inside the hollow longitudinally extending member 2. The magnetic field sensors C2 and R on the front side of the board 300 are visible and indicated. The other two magnetic field sensors C1 and L on the front side are also present but covered by the field sensors C2 and R, respectively. If an arrangement using eight magnetic field sensors is used, there are also magnetic field sensors C1*, C2*, L*, and R* on the rear side of the board. Only C1* and L* are visible from this perspective if the arrangement shown in FIG. 5 is used. It can also be seen that respective magnetic field sensors are axially and radially aligned.

Although certain presently preferred embodiments of the disclosed invention have been specifically described herein, it will be apparent to those skilled in the art to which the invention pertains that variations and modifications of the various embodiments shown and described herein may be made without departing from the spirit and scope of the invention. Accordingly, it is intended that the invention be limited only to the extent required by the appended claims and the applicable rules of law.

The invention claimed is:

1. A torque sensor comprising:
a at least partially hollow longitudinally extending member,
a magneto-elastically active region effective at the inner surface of the member in such a manner that torque applied to the member is proportionally transmitted to the active region, the active region comprising at least one region magnetically polarized such that the magnetized polarity becomes increasingly helically shaped as the applied torque increases;
a plurality of primary magnetic field sensors arranged approximate the at least one region for outputting a first signal corresponding to a torque-dependent magnetic flux emanating from the active region;
at least one secondary magnetic field sensor axially spaced in a first direction by a pre-determined first distance from the plurality of primary magnetic field sensors for outputting a second signal corresponding to an ambient magnetic flux emanating from a near magnetic field source;
at least one secondary magnetic field sensor axially spaced in a second direction opposite the first direction by a pre-determined second distance from the plurality of primary magnetic field sensors for outputting a third signal corresponding to the ambient magnetic flux emanating from the near magnetic field source;
means for adjusting the first signal using the second and the third signals thereby compensating for the effects of the near magnetic field source, characterized in that
the primary and secondary magnetic field sensors are arranged inside the longitudinally extending member.

2. The torque sensor of claim 1, wherein the at least one region is magnetized so that all of the domain magnetizations in the region lie within at most a plus or minus 45° limit of a circumferential direction of the member.

3. The torque sensor of claim 1 or 2, wherein the magnetic field sensors are vector sensors.

4. The torque sensor of claim 3, wherein the vector sensors are one of a Hall effect, magnetoresistance, magnetotransistor, magnetodiode, MAGFET field sensors, or fluxgate magneto meter.

5. The torque sensor of claim 1, wherein the member is an at least partially hollow shaft incorporated in an on-road or off-road vehicle, a ship, or an industrial process.

6. The torque sensor of claim 1, wherein the member is at least partially formed of ferromagnetic material.

7. The torque sensor of claim 1, comprising four primary magnetic field sensors radially aligned with respect to the longitudinally extending member; two secondary magnetic field sensors axially spaced in a first direction by a pre-determined first distance from the plurality of primary magnetic field sensors; and two secondary magnetic field sensors axially spaced in the second direction opposite the first direction by a pre-determined second distance from the plurality of primary magnetic field sensors.

8. The torque sensor of claim 1, wherein the field sensors are mounted on a board, in particular a single printed circuit board.

9. The torque sensor of claim 8, wherein two primary magnetic field sensors and two secondary magnetic field sensors are mounted on a first side of the board, and the other two primary and two secondary magnetic field sensors are mounted on the second, opposite side of the board.

10. The torque sensor of claim 9, wherein the positions of the two primary field sensors on the first side of the board fully overlap with the positions of the two primary magnetic field sensors on the second side.

11. The torque sensor of any one of claims 7 to 10, wherein the magnetic field sensors are arranged symmetrically with respect to a horizontal axis of reflection and a vertical axis of reflection both lying in the plane of the board and crossing each other in the geometrical gravity center of the magnetic field sensors.

12. A hydraulic power unit comprising the torque sensor of claim 1.

* * * * *